United States Patent [19]
Whitehead, Jr.

[11] Patent Number: 5,627,462
[45] Date of Patent: May 6, 1997

[54] APPARATUS AND METHOD FOR MEASURING POWER DEMAND FROM CONVENTIONAL WATT-HOUR UTILITY METERS

[75] Inventor: Culbreath C. Whitehead, Jr., Sarasota, Fla.

[73] Assignee: The Right Company, Sarasota, Fla.

[21] Appl. No.: 522,549

[22] Filed: Sep. 1, 1995

[51] Int. Cl.⁶ ................................................. G01R 21/00
[52] U.S. Cl. .................... 324/103 R; 364/483; 324/142; 324/96
[58] Field of Search ................... 324/103 R, 142, 324/96; 364/483; 328/160; 340/870.02

[56] References Cited

U.S. PATENT DOCUMENTS 4,924,412  5/1990  Leydier .................................. 364/483
5,495,238  2/1996  Baker et al. ....................... 340/870.02

*Primary Examiner*—Kenneth A. Wieder
*Assistant Examiner*—Barry C. Bowser
*Attorney, Agent, or Firm*—Dominik & Stein

[57] ABSTRACT

An apparatus and method for determining the power demand from a conventional watt-hour meter including a disk having a black mark imprinted on an edge thereof wherein the disk rotates in proportion to the amount of electrical power demanded by the energized electrical equipment connected thereto. The method comprising the steps of: positioning a scanning laser beam in front of the rotating disk of the watt-hour meter in a position transverse to the rotating disk such that the edge of the rotating disk is within the field of view of the scanning laser beam, scanning and then detecting the passings of the black mark as the disk rotates through at least two revolutions and computing the power demanded by the connected and energized electrical equipment based upon the amount of time between successive passings of the black mark.

10 Claims, 5 Drawing Sheets

APPARATUS AND METHOD FOR MEASURING POWER DEMAND FROM CONVENTIONAL WATT-HOUR UTILITY METERS

BACKGROUND OF THE INVENTION

1. Field of the Invention

This invention relates to watt meters. More particularly, this invention relates to instantaneous reading watt meters that measure the rotational speed of the spinning disk of a conventional utility kilowatt-hour meter to then compute the instantaneous power demand.

2. Description of the Background Art

In an era of energy conservation awareness, it is often desirable or necessary to determine the instantaneous electrical power demand of a particular piece of equipment or of an entire facility. Electrical power demand is expressed in watts or kilowatts, and should be clearly distinguished from electrical energy consumption that is expressed in watt-hours or kilowatt-hours.

Presently, there exist many types of watt meters that are designed to read instantaneous electrical power demand. However, such watt meters require a connection of current shunts or current transformers on each of the phase legs as well as connection of voltage leads to each of the phase legs. It should be appreciated that such connections are often made temporarily for test purposes. Consequently, such temporary connections often require the equipment or facility to be turned off or shut down while the temporary connections are made. After the measurements are taken, the equipment or facility must then be turned off or shut down to allow the watt meter to be disconnected. Obviously, such connections or disconnections are required for taking power demand measurements are time-consuming, and also potentially dangerous.

In essentially all facilities where electrically-operated equipment is employed, there is a watt-hour meter installed at the facility between the main distribution panel of the facility and the electrical feed from the commercial power utility. The principal object of this invention is to provide an apparatus and method for measuring power demands from conventional watt-hour meters.

More particularly, watt-hour meters include a rotatable metallic disk that is caused to angularly rotate as a linear function of the energy, expressed in watt-hours, being utilized. The angular rotation of the disk drives a series of reduction gears which, in turn, causes the incrementing of a numerical display register. The meter includes a glass housing so that the rotating disk and the display register can be readily viewed. The display register reveals the total amount of energy consumed.

Historically, utility companies "read" watt-hour meters on a monthly basis in order to determine the amount of energy consumed by a particular facility during that period so that the customer can be billed appropriately. Commonly, the watt-hour meters are read by a person who visually views the display register and manually records the total amount of energy consumed by that customer since the last reading. The data is then appropriately entered and then processed by computers to generate the customer's bill. More recently, there have been various electrical systems developed for electronically reading the watt-hour meter so that data indicative of the total energy consumed may then be electronically stored or transmitted to the utility company for processing.

For example, in U.S. Pat. No. 4,638,314 entitled "Meter Transponder Hybrid", there is disclosed circuitry for counting pulses indicative of energy consumption and for transmitting such consumption data over the utility power lines to a remote location. The circuitry is mounted onto a cylindrical-shaped printed circuit board. The circuit board is dimensioned to fit around the watt-hour meter mechanism inside of the glass housing.

Similarly, U.S. Pat. No. 5,130,641 entitled "Eddy Wheel Edge Sensor" discloses a sensor positioned inside of the glass housing of a watt-hour meter for detecting the rotation of the meter's disk. U.S. Pat. No. 5,241,306 entitled "System and Method for Introducing Meter Sensor Hystersis" discloses a light emitter and sensor that detects the rotation of a watt-hour disk by means of a notch that is formed onto the disk's shaft. U.S. Pat. No. 4,491,793 entitled "Detachable Magnetic Coupler Communication Apparatus" discloses an exteriorly-mounted device that optically communicates with the electronic circuitry within the watt-hour meter.

In U.S. Pat. No. 4,792,677 entitled "System for Use With a Utility Meter for Recording Time and Energy Use", there is disclosed a sensor that is positioned within the glass housing of a watt-hour meter for detecting the rotation of the disk. A circuit is provided for processing and storing signals from the sensor for the purpose of time-stamping energy consumption. The time-stamped data is then transmitted to a central computer for processing. The customer is billed for the energy consumption based in part upon the time of day in which the energy was consumed.

In U.S. Pat. No. 4,204,115 entitled "Removably Attachable Watt-Hour Meter Monitor Device", there is disclosed a monitoring device that is affixed to or positioned opposite the glass housing of a conventional watt-hour meter. The monitoring device includes a light source and a photo resistor, with appropriate lenses for focusing and receiving the light onto the rotating disk of the watt-hour meter. The monitor device serves to count the rotations of the rotating disk for computing electrical consumption. U.S. Pat. No. 4,636,637 entitled "Method and Apparatus for Detecting Motion Through a Transparent Enclosure, with Spurious Information Detecting and Compensating Means" discloses a similar monitoring device that is affixed to the glass housing of conventional watt-hour meter for measuring energy consumption.

Finally, in U.S. Pat. No. 5,214,587 entitled "Device for Monitoring Utility Usage", there is disclosed a meter sensor assembly that is attached exteriorly to the glass housing of a watt-hour meter. The sensor assembly detects the rotation of the meter's disk through the glass housing. Sensor signals from the sensor assembly are electrically connected via a cable to a customer interface unit that displays energy consumption. A reset feature is provided that allows the resetting of the accumulated energy consumption when the utility company reads the meter. This allows the customer to compare and verify the utility company's billing statement to the total energy consumed as indicated on the interface unit.

Unfortunately, none of the known prior art systems and devices, as exemplified in the above-identified patents, are configured or utilized to measure power demand. Therefore, there presently exists a need for an apparatus and method for measuring power demands from conventional watt-hour meters.

Another object of this invention is to provide an apparatus and method for measuring power demands from conventional watt-hour meters that is operable exteriorly of the glass housing of the watt-hour meter such that power demand measurements can be quickly and easily taken without having to gain access to the inside of the watt-hour meter enclosure.

Another object of this invention is to provide an apparatus and method for measuring power demands from a conventional watt-hour meter that employs a laser scanner that accurately detects each rotation of the meter's disk, thereby being substantially unaffected by spurious light and other potential sources of interference.

The foregoing has outlined some of the pertinent objects of the invention. These objects should be construed to be merely illustrative of some of the more prominent features and applications of the intended invention. Many other beneficial results can be attained by applying the disclosed invention in a different manner or modifying the invention within the scope of the disclosure. Accordingly, other objects and a fuller understanding of the invention may be had by referring to the following summary of the invention and the detailed description of the preferred embodiment, as well as the scope of the invention defined by the claims taken in conjunction with the accompanying drawings.

SUMMARY OF THE INVENTION

For the purpose of summarizing this invention, this invention comprises a laser apparatus and method for measuring power demands from conventional watt-hour meters. More particularly, the invention comprises a laser scanning head including a laser source, power supply component, optics, scanning elements, sensor circuit, and signal processing circuitry. In the preferred embodiment, the scanning head is hand-held and therefore capable of being aimed at the rotating disk of the watt-hour meter. In the hand-held embodiment, the front nose of the scanning head may be configured for resting against the front of the glass to minimize the movement of the scanning head during the taking of the power demand measurements. However, it is noted that the scanning head may be adapted for permanent or removable connection to the face of the glass housing.

The invention further comprises computing means for calculating power demand based upon the signals from the signal processing circuitry indicative of each rotation of the meter's disk. The invention still further comprises a display for displaying the power demand. In one embodiment, the computing means and the display are located in the laser scanning head. In another embodiment, the computing means and the display are located in a housing electrically connected to the scanning head by means of a cable.

Finally, the invention may comprise an audio and/or visual indicator for audibly and/or visually indicating each rotation of the watt-meter's disk such that the technician will know when the device is correctly aimed and when measurements are being taken.

Importantly, the laser power demand meter of the invention preferably scans rapidly up and down transverse to the horizontal plane of the rotating disk of the watt-hour meter. In this manner, the laser power demand meter of the invention need not be accurately aligned with the disk. Essentially all that is required is that the plane of the disk be located within the field of view of the scanning head. Therefore, should the scanning head be not be aligned with the disk, the edge of the disk is still scanned provided it is within the field of view of the scanning head.

The laser power demand meter of the invention allows a technician to determine the instantaneous power demand of a facility by simply measuring the power demand reading from the watt-hour meter of the facility. Further, to determine the instantaneous power demand of a particular piece of equipment, the power demand meter of the invention need only to take two power demand measurements-one with the piece of equipment on and one with it off. The difference in the measurements is the power demand of the piece of equipment.

The foregoing has outlined rather broadly the more pertinent and important features of the present invention in order that the detailed description of the invention that follows may be better understood so that the present contribution to the art can be more fully appreciated. Additional features of the invention will be described hereinafter which form the subject of the claims of the invention. It should be appreciated by those skilled in the art that the conception and the specific embodiment disclosed may be readily utilized as a basis for modifying or designing other structures for carrying out the same purposes of the present invention. It should also be realized by those skilled in the art that such equivalent constructions do not depart from the spirit and scope of the invention as set forth in the appended claims.

BRIEF DESCRIPTION OF THE DRAWINGS

For a fuller understanding of the nature and objects of the invention, reference should be had to the following detailed description taken in connection with the accompanying drawings in which.

Similar reference characters refer to similar parts throughout the several views of the drawings.

DETAILED DESCRIPTION OF THE PREFERRED EMBODIMENT

Figure 1:
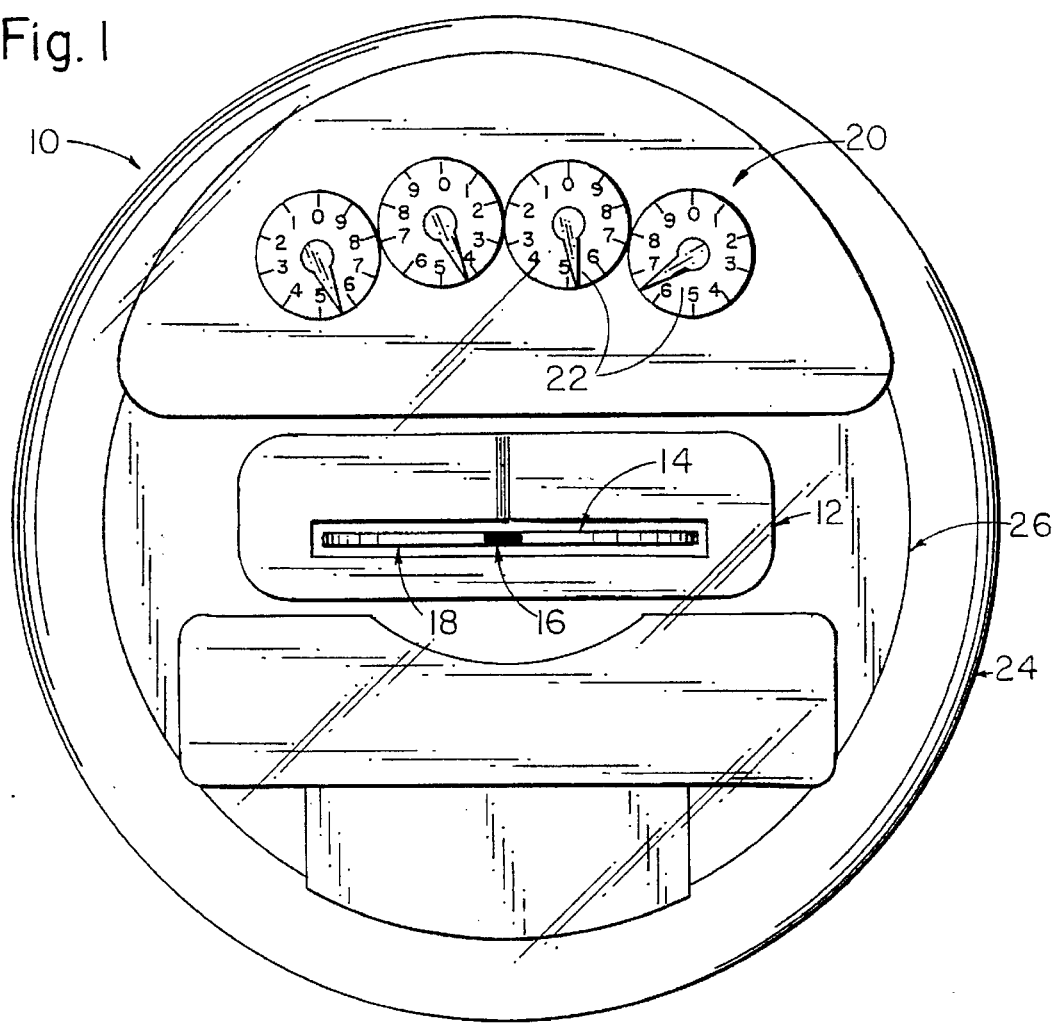
FIG. 1 is a frontal view of a conventional watt-hour meter illustrating the rotatable disk thereof and the black mark on the disk which is detected by the power demand meter of the invention.

Referring to FIG. 1, a conventional watt-hour meter, generally indicated by numeral 10, comprises a frame 12 that supports a rotating metallic disk 14 having a black mark 16 imprinted onto the edge 18 thereof. Although not shown, appropriate circuitry within the watt-hour meter 10 causes the disk 14 to rotate at a speed proportional to the electrical power demand. An indicator 20 having a plurality of dials 22 are provided for visually displaying the total amount of electrical energy consumed. The front portion of the watt-hour meter 10 is enclosed within a clear glass housing 24 removably mounted to the base 26 of the watt-hour meter 10. The glass housing 24 allows visualization of the dial 22 of the indicator 20 during reading of the watt-hour meter 10.

Figure 2:
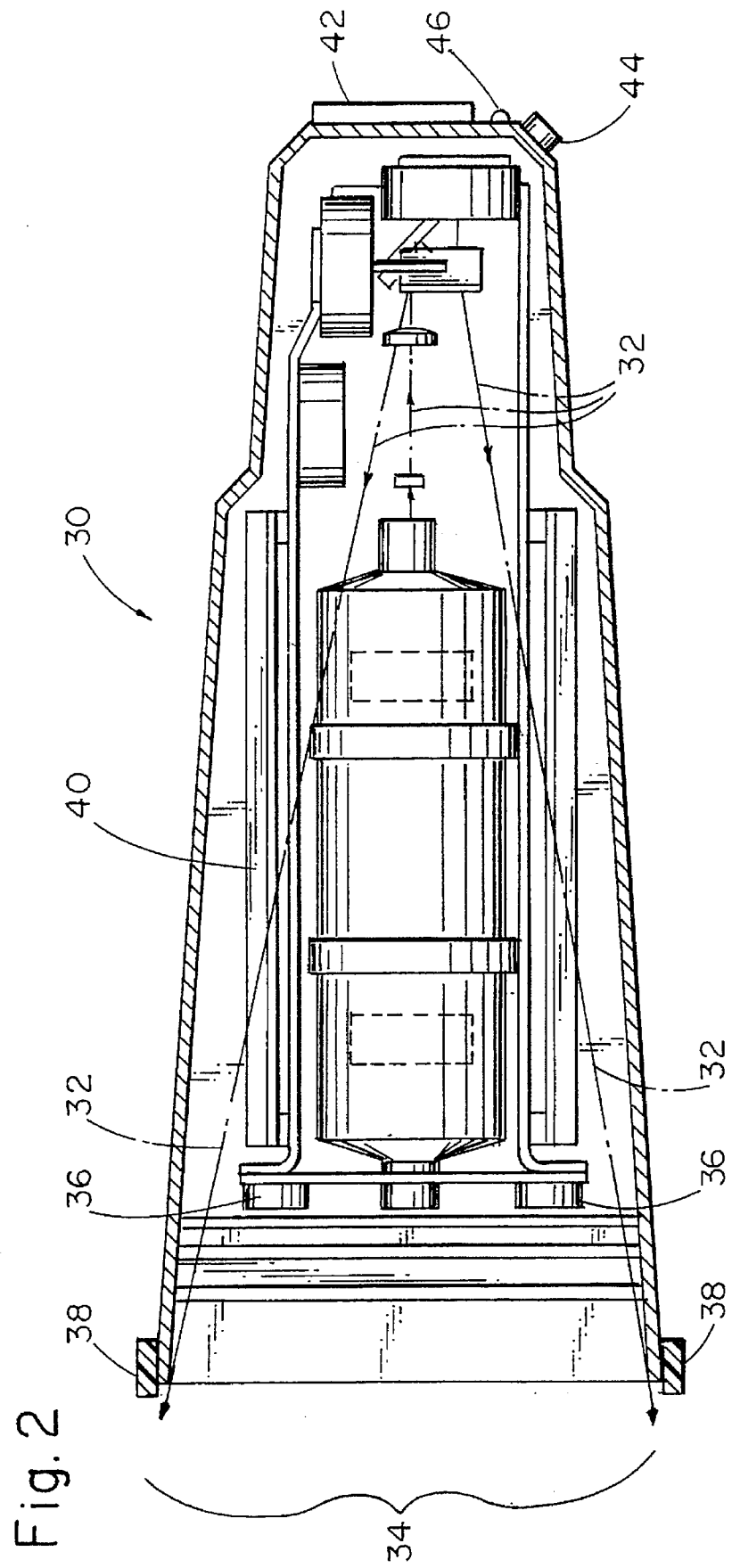
FIG. 2 is a diagrammatic view of the power demand meter of the invention illustrating the laser beam which is emitted therefrom and caused to scan within a predefined field of view.

The laser power demand meter, generally indicated by numeral 30, of the invention is illustrated in FIG. 2. The laser power demand meter 30 of the invention may comprise a conventional laser scanner such as the ones described and illustrated in U.S. Pat. No. 4,387,297 entitled "Laser Scanning System and Scanning Methods", U.S. Pat. No. 4,593,186 entitled "Portable Laser Scanning System and Scanning Methods" and U.S. Pat. No. 4,758,717 entitled "Narrow-Bodied, Single and Twin-Windowed Portable Laser Scanning Head for Reading Bar Code Symbols", the disclosures of each of which are hereby incorporated by reference herein. The details of construction and operation of such prior art laser scanners need not be described in detail except as noted below, since they constitute prior art and are amply disclosed in the above-referenced patents incorporated by reference herein.

Basically, laser scanners of the type utilized in the present invention, emit a laser beam 32 that scans up and down within a predefined field of view 34. The laser beam 32 that is reflected from the object being scanned, is received by one or more photodiodes 36 that output signals indicative of reflective and non-reflective portions of the object being scanned.

Figure 3:
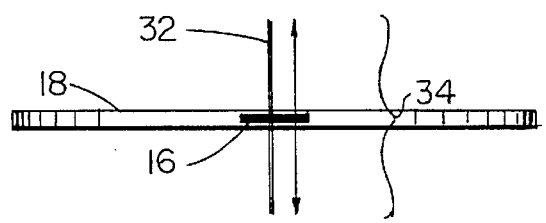
FIG. 3 is a diagrammatic view of the edge of the rotating disk of the watt-hour meter and the manner in which the scanning laser beam of the laser power demand meter of the invention scans transversely to the plane of the disk so as to detect the passing of the black mark of the disk upon each rotation thereof.

The laser power demand meter 30 of the invention preferably includes a cushioned front nose 38 that allows the meter 30 to be pressed against the front face of the glass housing 24 of the watt-hour meter 10. The laser power demand meter 30 of the invention is oriented such that the scanning laser beam 32 scans vertically to be transverse to the plane of the rotating disk 14 of the watt-hour meter 10. In this manner, the scanning laser beam 32 may detect the passing of the black mark 16 of the rotating disk 14 upon each revolution thereof (see also FIG. 3).

The laser power demand 30 of the invention comprises appropriate circuitry 40 for detecting the passing of the black mark 16 on the edge 18 of the rotatable disk 14. Circuitry 40 also includes computation means for timing the length of time between successive passings of the black mark 16 such that the rotation off the disk 14 may be accurately timed allowing computation of the power demand within such interval according to the following formula:

DEMAND (kilowatts)=WATTHOUR CONSTANT Kh (watt-hours/revolution)×3600 (seconds/hour)×1 (kilowatts/1000 watts)×MULTIPLIER (for the particular meter)÷DISK ROTATION RATE (seconds/revolution).

The power demand may then be displayed by means of a display positioned on the laser power demand meter 30. The circuitry 40 may include an audible and/or visual indicator to audibly and/or visually indicate the passing of each black mark 16.

Figure 4D:
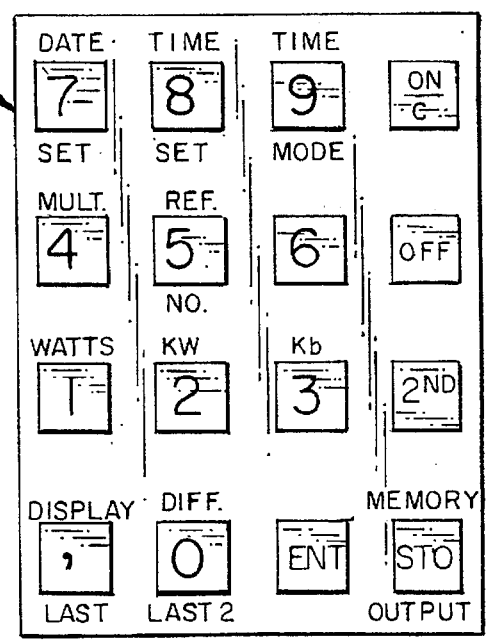
FIGS. 4A, 4B, 4C and 4D are block and flow diagrams of the electronic circuitry of the invention that detects the passings of the black mark on the rotating disk of the watt-hour meter and then computes the power demand based upon the passage of time between the successive passing of the black mark.
Figure 4A:
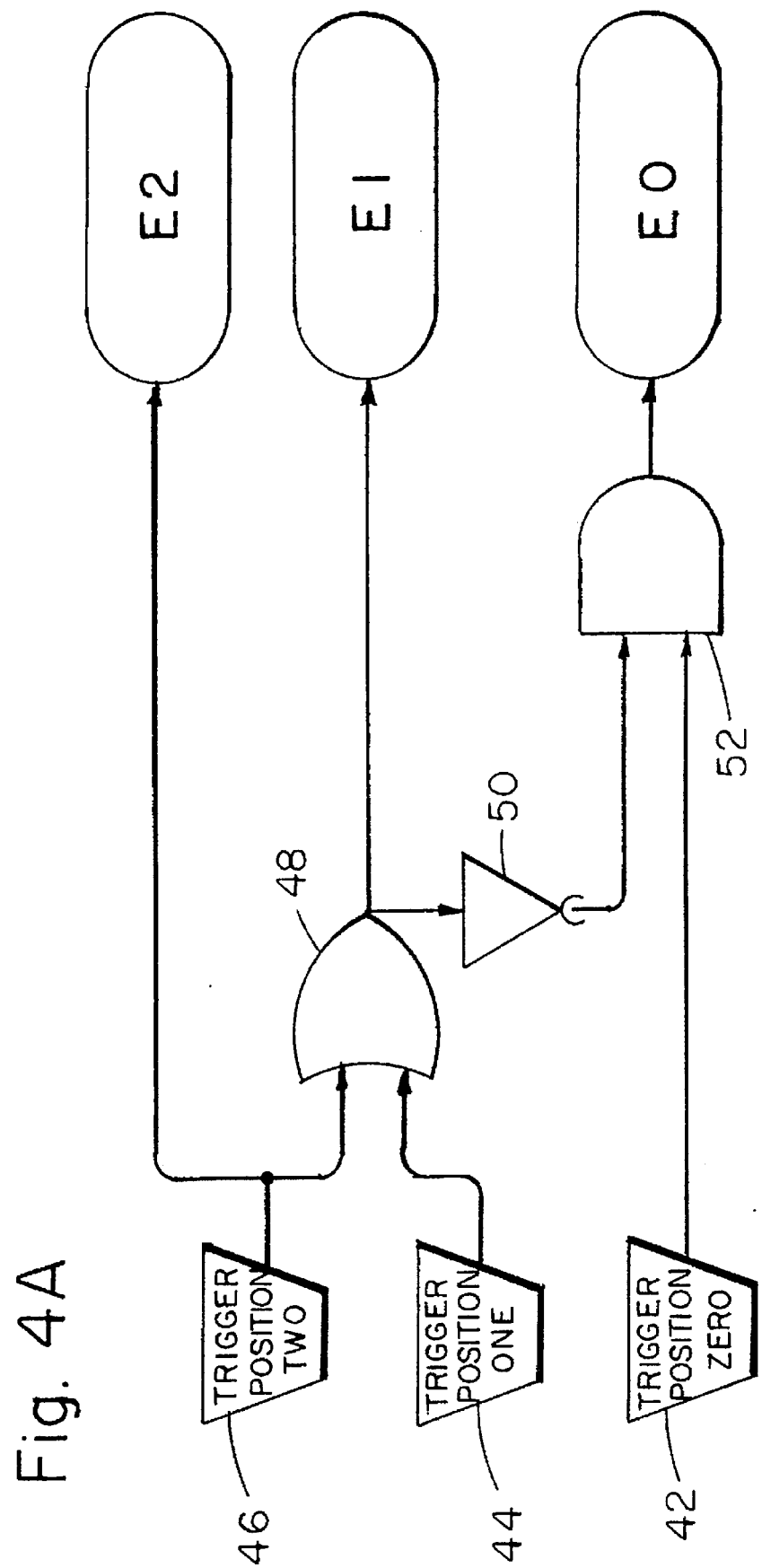

Referring now to FIG. 4A, the circuitry 40 preferably comprises trigger positions zero, one and two 42, and 46, respectively, electrically connected as shown to NOR gate 48, NOT gate 50 and AND gate 52 such that output E0, E1 and E2 are respectively energized as the trigger is squeezed into positions zero, one and two, respectively.

Figure 4B:
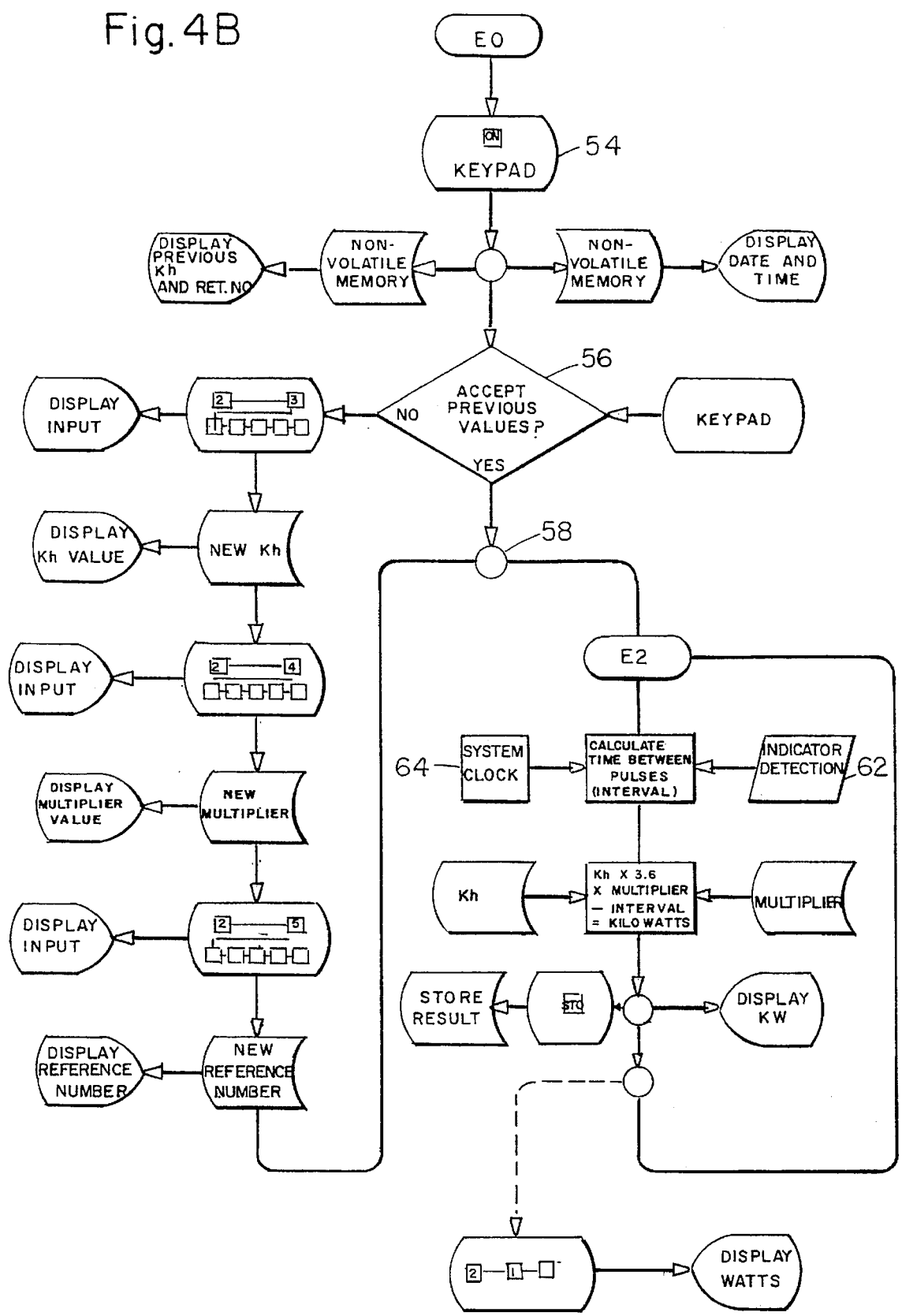

As shown in FIG. 4B, output E0 is operatively connected to keypad 54. As shown in FIG. 4D, keypad includes numeric keys 0–9 and a decimal key as well as function keys for "on", "off", "enter" and "store". A "second function" key allows selection of second functions for many of the keys such as date and time, time mode, watt-hour constant, multiplier, reference number, readout in watts or kilowatts, last display and difference between last two displays and, finally, memory output. The circuitry for keypad 54 is well known to those skilled in the art and therefore a detailed explanation is believed to be unwarranted.

Referring now to FIG. 4B, when the ON key of the key pad is depressed with the trigger in its zero position 42, the key pad is energized and the date, time, and time mode are displayed as well as the immediate previously-selected parameters of watts or kilowatts, watt-hour constant, multiplier, and reference number from nonvolatile memory. The operator is then presented with logic 56 to offer acceptance of such previous parameters. If the previous parameters are not acceptable, operator may then enter new parameters, each of which is displayed upon entry. Conversely, as indicated by logic 56, the operator may accept the previously-stored parameters. In both events, the routine flows to wait point 58 to await a signal E2 from trigger position two as described hereinafter.

Figure 4C:
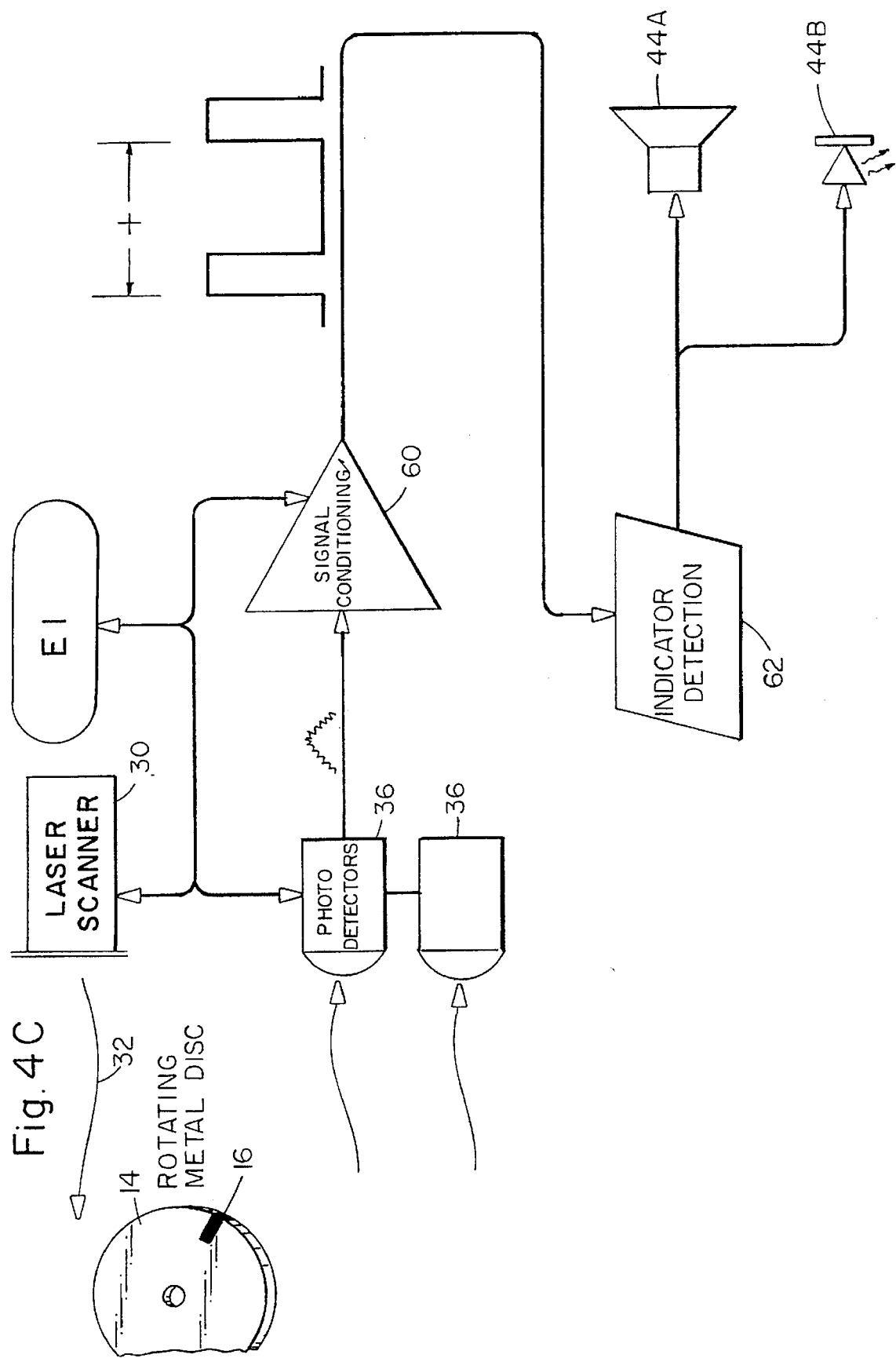

Returning to FIG. 4A in combination with FIG. 4C, it is seen that as the trigger is squeezed to trigger position one, 44, output E1 is energized. Output E1 is connected to laser scanner 30 to activate the same causing the scanning via laser beam 32 the rotating disk 14.

Output E1 is also connected to one or more photodetectors 36 to activate the same allowing them to receive the reflections of the laser beam 32 from disk 14. The outputs of the photodetectors 36 are connected to signal conditioner 60 that is energized via output E1. As shown, upon being conditioned via signal conditioner 60, the output thereof comprises a train of pulses having a period "t" representative of each passing of the black mark 16 of the rotating disk 14. Such pulse train is supplied to an indication detector 62 to produce audible and visual signals via speaker 44A and LED 44B to the operator.

Returning now to FIG. 4B, when the trigger is squeezed to position two 46, output E2 is energized allowing further processing beyond wait point 58. Specifically, when trigger is in position two 46, the time between pulses is calculated based upon output from the indication detector 62 and system clock 64. The 2processing then proceeds to compute the electrical demand measured in kilowatts according to the indicated formula and the stored parameters of watt-hour constant and any multiplier. Further processing allows storage of the result as well as the display of the electrical demand in kilowatts.

As shown in phantom in FIG. 4B, it is noted that the second function of key "1" of the keypad 54 may be utilized for displaying the calculated value in watts.

From the foregoing, it should be appreciated that leaving the trigger in position zero 42, the keypad may be energized allowing entry of new parameters or acceptance of previously-stored parameters. Upon further squeezing of trigger to position one 44, the laser scanner 30 is energized along with the photodetectors 36 and the signal conditioner 60 allowing acquisition of a pulse train indicative of each passing of the black mark 16 of the disk 14. Still further squeezing of the trigger to position two 46, causes computation of electrical demand in kilowatts or, if desired, watts.

Importantly, the positioning of the laser power meter 30 with the vertically disposed scanning laser beam 32 positioned transversely to the horizontally disposed rotating disk 14, assures accurate detecting of each passing of the black mark 16 on the edge 18 of the disk 14 since the rotating disk 14 will still be within the field of view 34 of the scanning laser beam 32 even if the laser power demand meter 30 is slightly vertically off-center relative to the rotating disk 14. Indeed, since the black mark 16 is imprinted not only on the edge 18 of the rotating disk 14 but also on the upper and lower surfaces thereof, accurate detection of the black mark 16 is still assured even if the axis of the laser power demand meter 30 of the invention is not colinear with a radii of the disk 14. Most importantly, it should be appreciated that the use of a laser beam for scanning minimizes interference from spurious light that might be shining through the glass housing 24 of the watt-hour meter 10 and onto the rotating disk 14.

The present disclosure includes that contained in the appended claims, as well as that of the foregoing description. Although this invention has been described in its preferred form with a certain degree of particularity, it is understood that the present, disclosure of the preferred form has been made only by way of example and that numerous changes in the details of construction and the combination and arrangement of parts may be resorted to without departing from the spirit and scope of the invention.

Now that the invention has been described,
What is claimed is:

1. A method for determining the electrical power demand from a conventional, watt-hour meter including a disk having a black mark imprinted on an edge thereof and means for rotating the disk in proportion to the amount of electrical power demanded by the energized electrical equipment connected thereto, comprising the steps of:

positioning a scanning laser beam in front of the rotating disk of the watt-hour meter in a position transverse to the rotating disk such that the edge of the rotating disk is within the field of view of the scanning laser beam;

scanning and then detecting the passings of the black mark as the disk rotates through at least two revolutions; and computing the power demanded by the connected and energized electrical equipment based upon the amount of time between successive passings of the black mark.

2. The method as set forth in claim 1, wherein a front portion of the watt-hour meter is enclosed within a transparent housing and wherein the step of scanning comprises scanning through the transparent housing.

3. The method as set forth in claim 2, further comprising the step of displaying the computed power demand.

4. The method as set forth in claim 3, wherein the scanning laser beam is contained within a housing having a front nose and wherein the method of the invention further comprises the step of pressing the front nose onto the appropriate surface of the transparent housing.

5. The method as set forth in claim 1, further comprising the step of producing an audible sound upon detection of the passing of the black mark of the rotating disk.

6. An apparatus for determining the power demand, the watt-hour meter including a disk having a black mark imprinted on an edge thereof and means for rotating the disk in proportion to the amount of electrical power demanded by the energized electrical equipment connected thereto, comprising in combination:

means for positioning a scanning laser beam in front of the rotating disk of the watt-hour meter transverse to the rotating disk such that the edge of the rotating disk is within the field of view of the scanning laser beam;

means for scanning and then detecting the passings of the black mark as the disk rotates through at least two revolutions; and means for computing the power demanded by the energized electrical equipment connected thereto based upon the amount of time between successive passings of the black mark.

7. The apparatus as set forth in claim 6, wherein a portion of the watt-hour meter is enclosed within a transparent housing and wherein the means for scanning comprises means for scanning through the transparent housing.

8. The apparatus as set forth in claim 6, further comprising means for displaying the computed power demand.

9. The apparatus as set forth in claim 6, wherein the scanning laser beam is contained within a housing having a nose that is pressable against a surface of the transparent housing.

10. The apparatus as set forth in claim 6, further comprising means for producing an audible sound or visual indication upon detection of the passing of the black mark of the rotating disk.

* * * * *